US012646967B2

(12) United States Patent
Parkhe et al.

(10) Patent No.: US 12,646,967 B2
(45) Date of Patent: Jun. 2, 2026

(54) AUTO-SCALABLE, RESILIENT CLOUD-BASED POWER QUALITY ANALYSIS ENGINE

(71) Applicant: EATON INTELLIGENT POWER LIMITED, Dublin (IE)

(72) Inventors: Reema Parkhe, Bhopal (IN); Surabhi Malav, Boisar (IN); Heena Singh, Alwar (IN)

(73) Assignee: EATON INTELLIGENT POWER LIMITED, Dublin (IE)

( * ) Notice: Subject to any disclaimer, the term of this patent is extended or adjusted under 35 U.S.C. 154(b) by 671 days.

(21) Appl. No.: 18/103,604

(22) Filed: Jan. 31, 2023

(65) Prior Publication Data

US 2024/0258827 A1 Aug. 1, 2024

(51) Int. Cl.
| | |
|---|---|
| *H02J 13/12* | (2026.01) |
| *G01R 21/133* | (2006.01) |
| *G01R 22/06* | (2006.01) |
| *H02J 13/13* | (2026.01) |

(52) U.S. Cl.
CPC .......... *H02J 13/12* (2026.01); *G01R 21/1333* (2013.01); *G01R 22/063* (2013.01); *H02J 13/1331* (2026.01)

(58) Field of Classification Search
CPC .......................... G01R 19/2513; G01R 21/133
See application file for complete search history.

(56) References Cited

U.S. PATENT DOCUMENTS

| | | | | |
|---|---|---|---|---|
| 2016/0109495 A1* | 4/2016 | Sterkel | .................. | H04L 67/303 |
| | | | | 702/62 |
| 2021/0028648 A1* | 1/2021 | Gamroth | ................ | G05B 15/02 |
| 2021/0098988 A1* | 4/2021 | Gokhale | ................ | H02J 3/008 |
| 2021/0184461 A1 | 6/2021 | Bickel et al. | | |

(Continued)

FOREIGN PATENT DOCUMENTS

| | | | |
|---|---|---|---|
| CN | 110809017 B | 2/2020 | |
| CN | 112788142 B * | 3/2023 | ............. H04L 67/12 |

OTHER PUBLICATIONS

Translation of FOR cited reference (Year: 2021).*

(Continued)

*Primary Examiner* — Thomas M Hammond, III
(74) *Attorney, Agent, or Firm* — Eckert Seamans Cherin & Mellott, LLC

(57) ABSTRACT

A power quality analysis system includes a smart breaker network having a smart meter coupled to a load and structured to measure power quality parameters; a cloud including a hub that is coupled to the smart breaker network and structured to receive the power quality parameters from the one or more smart meters, a data manager structured to store data including at least the power quality parameters, a power quality analysis (PQA) algorithm structured to identify the power quality parameters to be measured and analyzed and define thresholds for the power quality parameters, and a PQA engine that is structured to read the power quality parameters and perform PQA of the power quality parameters based at least in part on the PQA algorithm; and an output device communicatively coupled to the cloud and structured to expose resultant data of the PQA to an end user.

15 Claims, 5 Drawing Sheets

(56) References Cited

U.S. PATENT DOCUMENTS

2022/0069578 A1    3/2022  Bickel et al.

OTHER PUBLICATIONS

V. Pjevalica et al. "Cloud Based Data Acquisition via IoT for Electric Power Quality Monitoring" IEEE Conference | Publication | IEEE Explore, Published in: 2019 Zooming Innovation in Consumer Technologies Conference (ZINC), Date of Conference: May 29-30, 2019, https://ieeexplore.ieee.org/document/8769386, 3 pp.

A. Christe et al. "Open Power Quality: An open-source framework for power quality collection, analysis, visualization, and privacy" Published in: 2016 IEEE Power & Energy Society Innovative Smart Grid Technologies Conference (ISGT), Date of Conference: Sep. 6-9, 2016, https://ieeexplore.ieee.org/document/7781164, 3 pp.

X. Yao Zheng et al. "An Embedded-Based Distributed Private Cloud: Power Quality Event Classification" Published in: 2014 IEEE Intl Conf on High Performance Computing and Communications, Date of Conference: Aug. 20-22, 2014, https://ieeexplore.ieee.org/document/7056900, 3 pp.

P. Nallagownden et al. "Development of real-time industrial energy monitoring system with PQ analysis based on IoT" Published in: 4th IET Clean Energy and Technology Cconference (CEAT 2016), Date of Conference: Nov. 14-15, 2016, https://ieeexplore.ieee.org/document/8278625, 2 pp.

* cited by examiner

AUTO-SCALABLE, RESILIENT CLOUD-BASED POWER QUALITY ANALYSIS ENGINE

FIELD OF THE INVENTION

The disclosed concept relates generally to a power quality analysis system, and in particular, to an auto scalable, resilient cloud based power quality analysis engine.

BACKGROUND OF THE INVENTION

Power quality analysis is a process that determines overall safety and efficiency of a power supply within a distributed power system for a building or a facility. It determines power quality by analyzing both power flow and related factors. There are numerous reasons why electric power may have poor power quality, which leads to economic and opportunity losses. Accordingly, it is important to have an accurate power quality analyzers to reduce such losses. Currently, most of the power quality analyzers in the market perform mathematical computation through embedded devices (e.g., microcontrollers embedded within a smart meter, a circuit breaker, etc.), which then transmit or push the computed value to the cloud. For smooth data processing and complex computation, it is required to distribute the loads so that the computation remains constant irrespective of the connected devices (e.g., Internet of Things (IOT) devices). However, if a number of connected IoT devices increases significantly, managing large-scale distributed infrastructures becomes very challenging. For example, configuration management, OS patches and software updates and other common operational requirements need to be handled manually. Such manual management of a large-scale distributed infrastructures is time consuming. Further, the microcomputer based computation for the power quality analyzers is still-maturing and does not have a robust ecosystem.

There is a need for improvement in power quality analyzers for power distribution systems.

SUMMARY OF THE INVENTION

A power quality analysis system is provided. The power quality analysis system includes a smart breaker network having one or more smart meters coupled to respective loads and structured to measure power quality parameters; a cloud comprising a hub that is coupled to the smart breaker network and structured to receive the power quality parameters from the one or more smart meters, a data manager structured to store data including at least the power quality parameters, a power quality analysis (PQA) algorithm structured to identify the power quality parameters to be measured and analyzed and define thresholds for the power quality parameters, and a PQA engine that is structured to read the power quality parameters and perform PQA of the power quality parameters based at least in part on the PQA algorithm; and an output device communicatively coupled to the cloud and structured to expose resultant data of the PQA to an end user.

Another example embodiment provides a method of power quality analyzing of a distributed power system including a smart breaker network coupled to a cloud. The method includes measuring real-time, by a smart meter of the smart breaker network, power quality parameters associated with the smart breaker network; transmitting real-time, by the smart meter, the measured power quality parameters to a hub in the cloud; reading and transforming the measured power quality parameters; performing, by a power quality analysis (PQA) engine of the cloud, PQA of the transformed power quality parameters based on a PQA algorithm stored in a data manager of the cloud; and exposing resultant data of the PQA to an end user.

BRIEF DESCRIPTION OF THE DRAWINGS

A full understanding of the invention can be gained from the following description of the preferred embodiments when read in conjunction with the accompanying drawings in which.

DETAILED DESCRIPTION OF THE INVENTION

Figure 1:
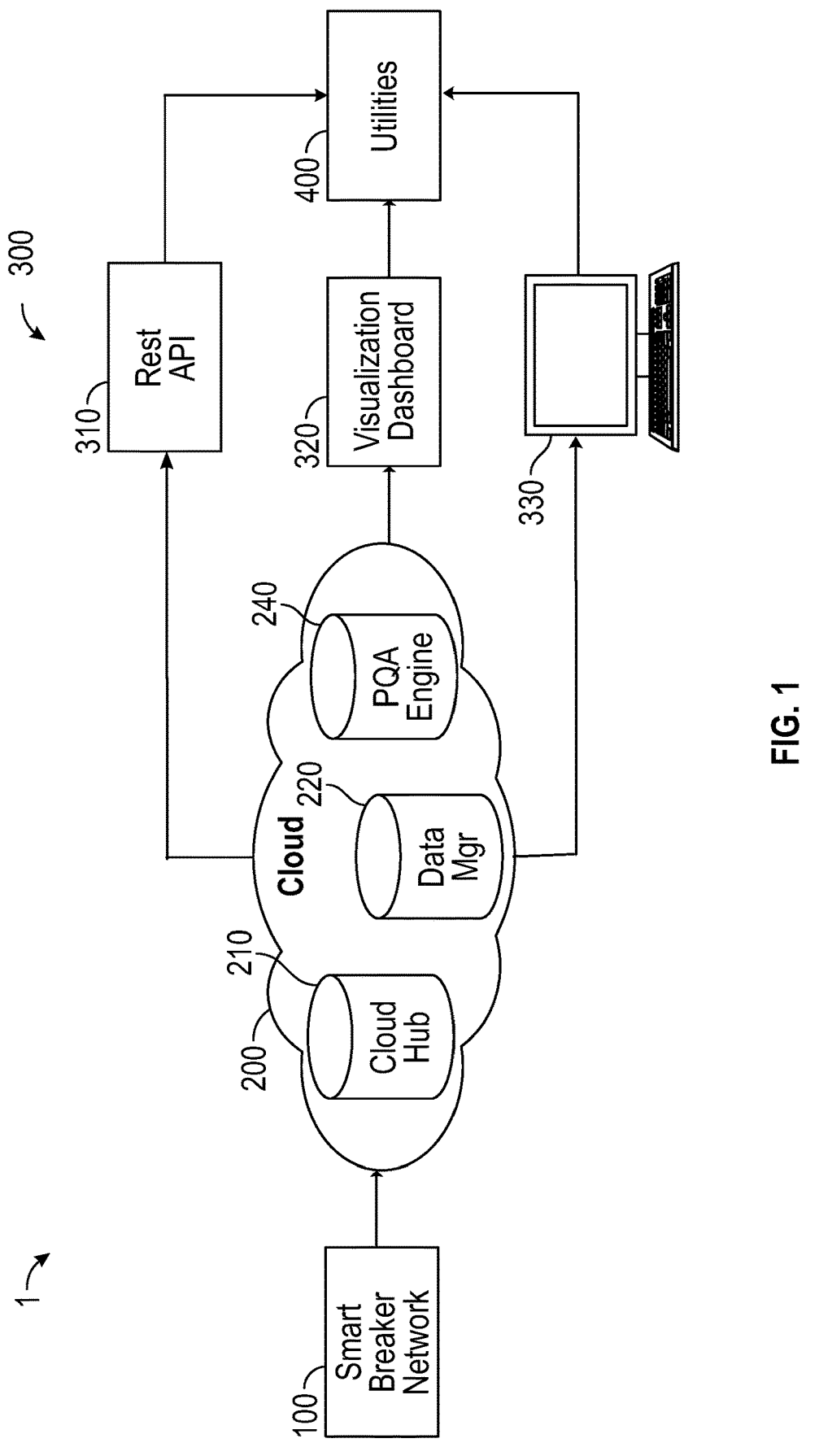
FIG. 1 is a cloud based power quality analysis system in accordance with a non-limiting embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

As employed herein, the term "charging box" shall mean an apparatus having any geometry (e.g., box-shaped and non-box shaped geometries), and that is structured to produce an electric charge for the purpose of charging an EV.

FIG. 1 illustrates a cloud based power quality analysis system 1 in accordance with a non-limiting embodiment of the disclosed concept. The system 1 includes a smart breaker network 100, a cloud 200, and an output device 300 communicatively coupled to the cloud 200 and an end user 400. The smart breaker network 100 includes at least one or more smart meters coupled to respective loads and structured to measure real-time power quality parameters. The smart meters are also coupled to the cloud 200 and structured to transmit real-time the measured power quality parameters to the cloud 200. A smart meter may include a smart utility meter, a power quality meter or another metering device (e.g., without limitation, standard non-smart breaker meter, circuit breakers, relays, filters, etc.). The output device 300 may be any device (e.g., APIs 310 coupled to API gateways, visualization dashboards 320 available on the cloud 200, any other computing devices 330 such as a laptop, workstation, or mobile devices) capable of exposing data including the power quality parameters or resultant data of power quality analysis to the end user 400.

The cloud 200 includes a hub 210, a data manager 220, and a power quality analysis (PQA) engine 240. The hub 210 is a cloud hub and includes an Internet of Thing (IoT) Hub 212, an event hub 214 and a time series database 216. The IoT Hub 212 includes a security-enhanced communication channel via which data from the one or more smart meters are transmitted and/or received. The event hub 214 receives the measured power quality parameters associated with an event (e.g., overcurrent, a low level of ink in a case of a printer, etc.). The hub 210 provides a cloud-hosted solution back end to connect virtually any device within the smart breaker network 100 and extends solutions from the cloud 200 to the edge with per-device authentication, built-in device management, and scaled provisioning.

The data manager 220 is a database structured to store data including at least the measured power quality parameters. The database may be a no sequel (NoSQL) database.

The cloud 200 also includes a PQA algorithm (e.g., a PQA algorithm 230 of FIG. 2) created by the end user 400 or an engineer based on the needs of the end user 400. The PQA algorithm is structured to identify the power quality parameters to be measured and analyzed and define thresholds for the power quality parameters. The PQA algorithm may be stored in the data manager 220 or a memory within the cloud 200. The PQA algorithm may include a schedule for measuring the power quality parameters and performing PQA of the measured power quality parameters based on the schedule. The PQA algorithm may also include an event trigger-based service that reads, transforms and processes the power quality parameters received from the one or more smart meters. The event trigger-based service may read or ingest the power quality parameters from the event hub 214, transform the power quality parameters to remove null or blank data and process the power quality parameters for the PQA. The PQA algorithm may also define and structure manners in which the resultant data of the PQA become available to the end user 400.

The PQA engine 240 is structured to read the transformed power quality parameters and perform PQA of the power quality parameters based at least in part on the PQA algorithm. The PQA includes mathematical computation of the power quality parameters based on the PQA algorithm. The power quality parameters identified by the PQA algorithm to be computed includes at least one of Vpn, Vpp, Amp, Watt, VAR, VA, PF, or frequency. The power quality parameters may further include at least one of software zero crossing detection, unbalance, individual harmonics, total harmonic distortion (THD) and total demand distortion (TDD). Vpn indicates network power. Vpp indicates peak-to-peak power. Amp indicates current. Watt indicates real power. VAR indicates reactive power. VA represents apparent power. PF indicates power factor which refers to how much electrical power goes toward producing useful work. A low power factor means a large amount of energy is being lost in the network 100 in the form of wasted heat, which generally results in higher energy bills and equipment degradation. Software zero crossing detection is used to track changing in the sine waveform from positive to negative or vice versa while it crosses zero voltage. It can also be used as a Square Wave Generator. A zero crossing detector has many applications such as time marker generator, phase meter, frequency counter, etc. Unbalance occurs, in 3 phase power systems, when single phase load does not draw the same amount of current on each phase, resulting in a greater stress on the neutral conductor. That is, where there is zero current on the neutral wire, the three phase power systems are balanced. However, an amount of current on the neutral wire increases as the unbalance of phase current increases, resulting in overheating and risk of fire. Individual harmonics are forms of waveform distortion (e.g., without limitation, in circuits containing semiconductor based electronics such as LED, computer, or robotics). These non-linear loads impose higher frequency sine wave, resulting in more power lost in the form of wasted heat. The magnitude of each harmonic frequency can be measured using power quality meters and are generally displayed in the form of a harmonic spectrum. THD and TDD are sometimes used with power quality meters to simplify harmonic distortion as a single measurement rather than an entire spectrum. It is to be understood that the aforementioned power quality parameters are for the illustrative purposes only, and thus, other power quality parameters may be added to the PQA algorithm based on the user needs and/or preferences.

The PQA engine 240 may include a cloud analytics service and scripts and notebooks and perform PQA using the cloud analytics service and scripts and notebooks. The computation result of the PQA will be stored back to the data manager 220 and can be made available to the end user 400 as needed. Resultant data can be streamlined using pipelines which is based on schedulers (i.e., the schedules set by the PQA algorithm) and can run at regular intervals (e.g., without limitation, hourly, daily, weekly) depending on the user's need. The PQA engine 240 also provides auto-scale service. For example, when there is an increase in a number of the smart meters and/or loads coupled thereto, the PQA engine 240 performs an automatic scale-up of the system 1. The PQA engine 240 calculates how many new nodes are needed to meet the current CPU and memory requirements, and issues a scale-up request to add the required number of new nodes. When there is a decrease in the number of the smart meters and/or the loads, the PQA engine 240 performs an automatic scale-down triggered by the PQA algorithm. The auto-scale may be performed for each computation of the power quality parameters as an event driven system including serverless analytics and database does.

The resultant data based on the PQA can be made available for further analytics to machine learning (ML) and/or visualization tools as needed. The ML algorithm may be created by the end user 400 or an engineer and stored in the data manager 220 or memory of the cloud 200. The ML algorithm uses the data stored in the data manager 220 for training. The PQA algorithm may include the ML algorithm. Alternatively, the cloud 200 may provide the ML capabilities.

Further, the resultant data may be exposed or become available to the end user 400 via the output device 300 including at least one of an API 310 coupled to the data manager 220 in the form of a microservice (i.e., a subscription service for accessing the power quality parameters and/or the historical data as needed for a fee), a visualization dashboard 320, or a real-time streaming device 330 (e.g., without limitation, a display of a computing device such as a laptop, a notebook, a workstation, a mobile device, a smart phone, etc.). The end user 400 may verify the destination table for the resultant data.

Figure 2:
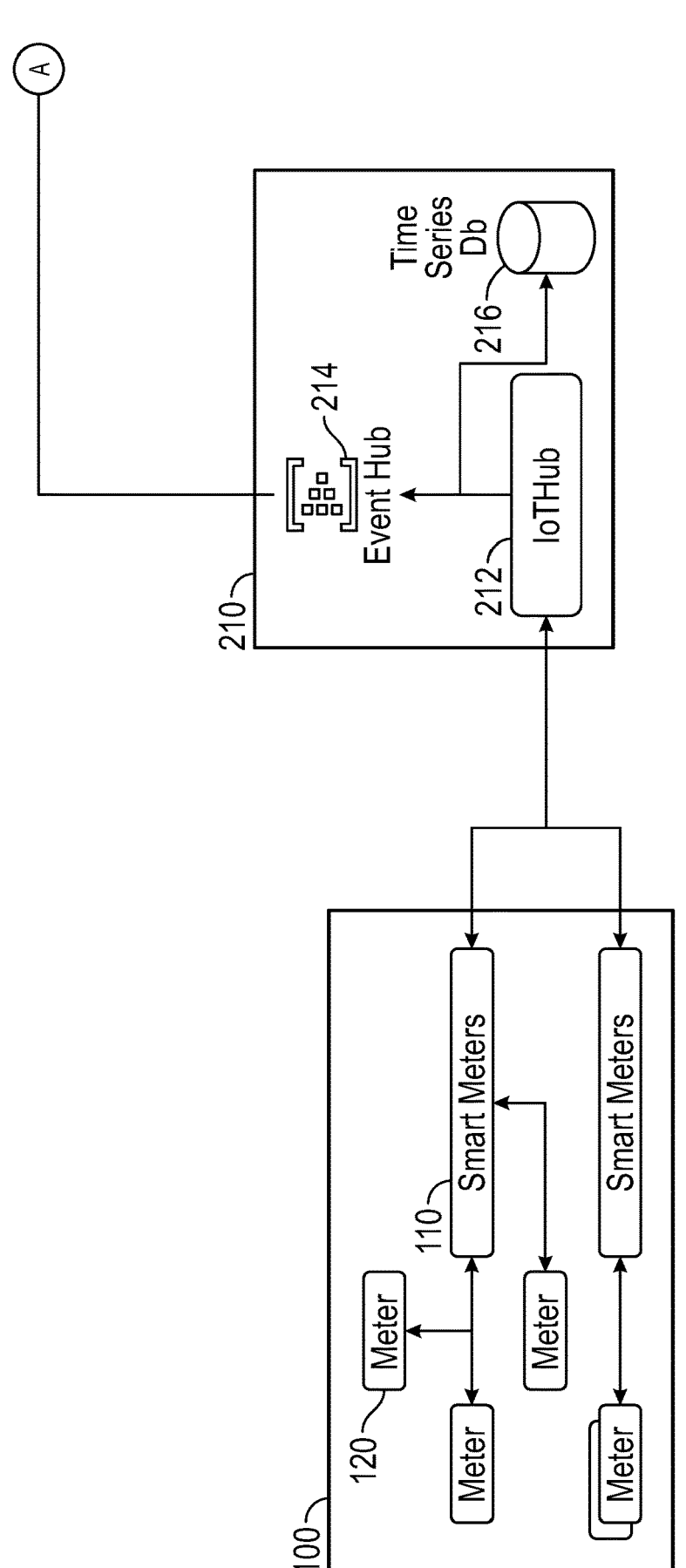
FIG. 2 is a cloud based power quality analysis system of FIG. 1 in further detail in accordance with a non-limiting embodiment of the disclosed concept.
Figure 2:
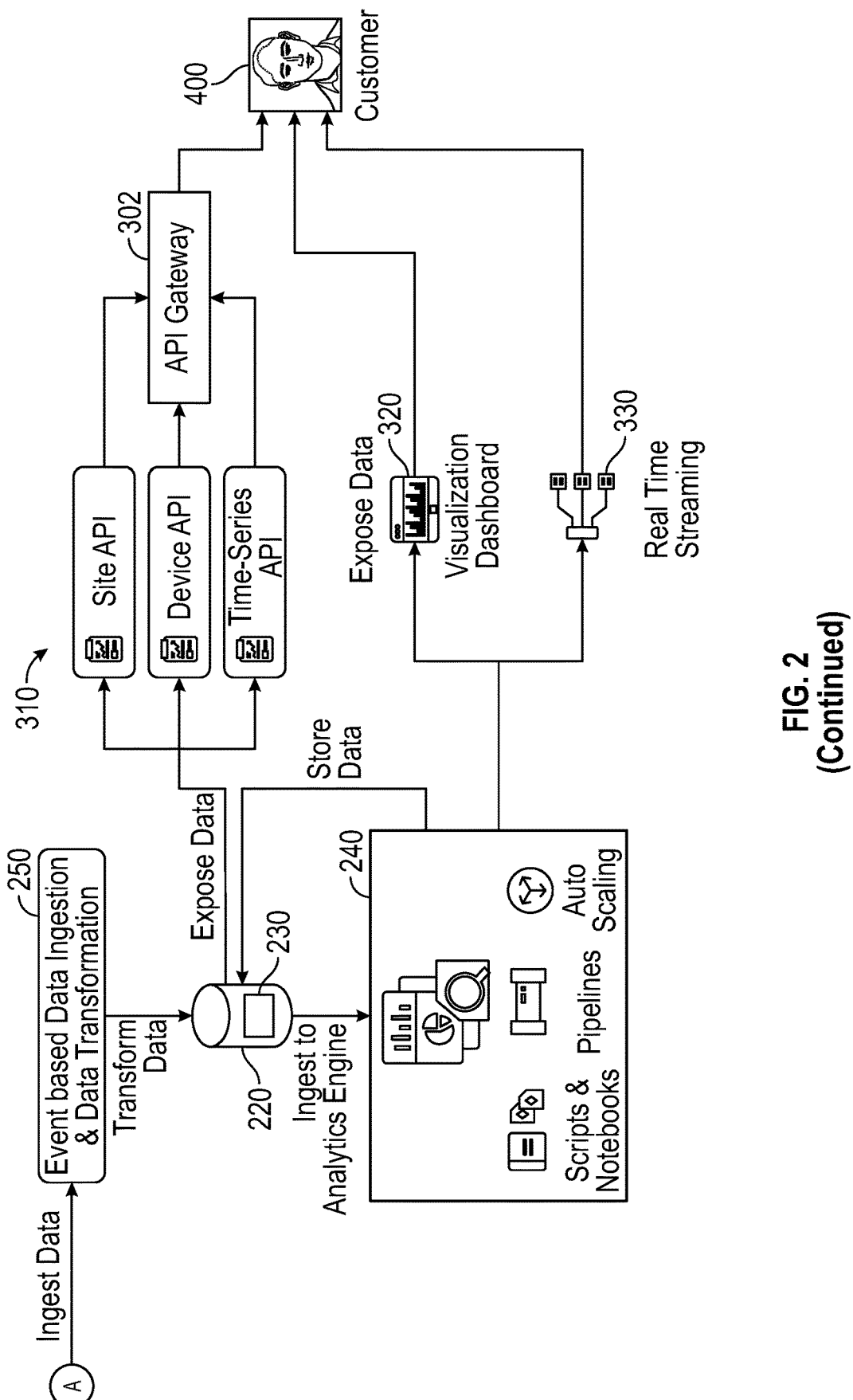

FIG. 2 illustrates the cloud based power quality analysis system 1 of FIG. 1 in further detail in accordance with a non-limiting embodiment of the disclosed concepts. In FIG. 2, the smart breaker network 100 includes a plurality of smart meters 110 and other metering devices 120 (e.g., without limitation, power quality meters, standard non-smart breaker meters, circuit breakers, relays, filters, etc.) coupled to the smart meters 110. The smart meters 110 measure the real-time raw data of the power quality parameters and transmit the measured power quality parameters to the IoT Hub 212. The IoT Hub 212 may be an Azure IOT Hub of Microsoft® corporation. The IoT Hub 212 may include security communication channels via which the power quality parameters are transmitted or received from the one or more smart meters 110 or resultant data are exposed to the end user 400. The security may be further enhanced by adding the user authentication (e.g., a user ID and password) for receiving resultant data of the PQA.

The IoT Hub 212 may include or be coupled to an event hub 214 and/or time series database 216. The real-time power quality parameters related to events (e.g., an over-current event) may be transmitted to the event hub 214 from the IoT Hub 212. An event trigger-based service 250 stored in the PQA algorithm 230 or the cloud 200 reads the power quality parameters and transforms (e.g., remove null or blank data) the power quality parameters to data usable for the PQA engine 240 for PQA. The transformed power quality parameters are stored in the data manager 220. The data manager 220 may be, e.g., Azure Cosmos DB®, which may have analytics enabled. Azure Cosmos DB® can be used here since it is fully managed NoSQL (no sequel) database for modern app development and offers single-digit millisecond response times, automatic and instant scalability and a guaranteed speed at any scale. The data manager 220 may also include the PQA algorithm 230 created by the end user 400 or an engineer and stored therein. The data manager 220 is coupled to the PQA engine 240 via a database link and the transformed data stored in the data manager 220 is transmitted to the PQA engine 240 via the database link and available on the PQA engine 240 for PQA immediately upon transformation.

The PQA engine 240 then performs PQA based on the PQA algorithm 230. The PQA engine 240 may be Azure Synapse, and performs PQA using Python scripts and note-book available therein. Azure Synapse has varieties of offerings for scheduling, automating, and transforming data and can be used to leverage data flow and pipelining to perform mathematical calculations of the power quality parameters. Further, while numerous cloud providers have cloud-native hybrid transactional and analytical processing (HTAP) capability that enables users to run near real-time data transformation and analytics over operational data in the database, Azure Synapse, however, reads real-time trans-formed data from Azure Cosmos DB® and performs the PQA mathematical calculations using Python scripts and notebooks. Further, Azure Synapse provides the freedom to query data on the end user's own terms, using either serverless or dedicated options at scale. The PQA may be performed automatically based on a schedule included in the PQA algorithm 230 and set forth by the end user 400 or the engineer based on the need.

The PQA engine 240 performs the PQA automatically based on the schedule (e.g., without limitation, hourly, daily, or weekly) using pipelines available therein as per the user's need. The PQA engine 240 performs PQA based on the PQA algorithm 230. The PQA includes mathematical computa-tion of Vpn, Vpp, Amp, Watt, VAR, VA, PF, software zero crossing detection, unbalance, individual harmonics, THD and TDD based on the PQA algorithm 230. The resultant data of the PQA may be stored back to the data manager 220 and can be made available to the end user 400 based on the user's need. Alternatively, the PQA may be done ad hoc by creating data flow for the mathematical formulas for differ-ent channels available in the PQA engine 240. To create the data flow, information for the relevant channels are obtained from the data manager 220. Then, expression can be used to perform the PQA calculation in a data flow window. The expression supports SQL queries-based operations, which can easily perform complex mathematical calculation for the PQA. Most analytics services have multi language support for data transformation. Using, e.g., without limitation, SQL Spark or PySpark, all types of complex mathematical cal-culations may be performed for the PQA. The PQA engine 240 then verifies the resultant data of the PQA and saves the resultant data to a destination (e.g., without limitation, a database container). The data flow may be debugged and tested.

The resultant data can be made available for further analytics to machine learning (ML) and/or visualization tools 320 as needed. The resultant data can be well combined with API 310 and exposed to the end user 400 such as utility companies. The API 310 may include site API, device API, and/or time-series API that are coupled to the API gateway 302 that expose the resultant data to the end user 400. Monetization can be done with the API access to the end user 400 in the form of microservices. The end-user 400 may also receive the resultant data via a visualization dashboard 320 or real-time streaming on a display of a computing device (e.g., without limitation, a mobile device, a smart phone, a cellular phone, a laptop, etc.) 330. Further, the end-user 400 may verify the destination table for the resul-tant data. With the security features available in the cloud 200 (e.g., security channels) and partner solutions (e.g., the user authentication process using a user ID and password), the raw power quality parameters and/or the resultant data are exposed to the end users 400 without compromising the original cloud database (i.e., the IoT Hub 210).

Thus, the exemplary embodiments according to the dis-closed concept offers an end-to-end cloud-based solution, which is highly auto-scalable and resilient to perform com-plex mathematical computation on the raw data (measured power quality parameters) of the devices (e.g., the loads, smart meters, etc.). The PQA engine 330 can be easily adopted on any cloud and perform the complex mathemati-cal computation on the fly (ad hoc) or later as needed. In addition, the PQA engine 330 performs limitless analytics, derives accurate, granular insights from the raw data using real-time streaming, computing data analysis and machine learning techniques, and provides the end-to-end PQA solu-tion that includes data preparation, data management, data warehousing, and AI tasks. Further, the PQA engine 330 allows auto-scalability with a distributed power system. For example, if there is an increase in a number of devices (e.g., without limitation, smart meters, loads, etc.) within the smart meter network 100, the cloud 200 (e.g., Azure Cosmos DB® combined with Azure Synapse) provides auto-scale service which is available for each computation of the power quality parameters as an event driven system including serverless analytics and database does. It calculates how many new nodes are needed to meet the current CPU and memory requirements, and then issues a scale-up request to add the required number of nodes. Additionally, the embodi-ments utilize enhanced securities for the raw and/or resultant data provided by the cloud 200. For example, the embodi-ments utilize capabilities available in the cloud platform to assist the user in meeting security requirements through built-in features (e.g., security channels) and through partner solutions (e.g., a user authentication using a user ID and password) that can be deployed on the cloud 200. Finally, by using the computing power of the cloud 200 for the complex computation of PQA, the embodiments removes the com-putation burdens placed on the microcontrollers of the devices within the distributed power system.

Figure 3:
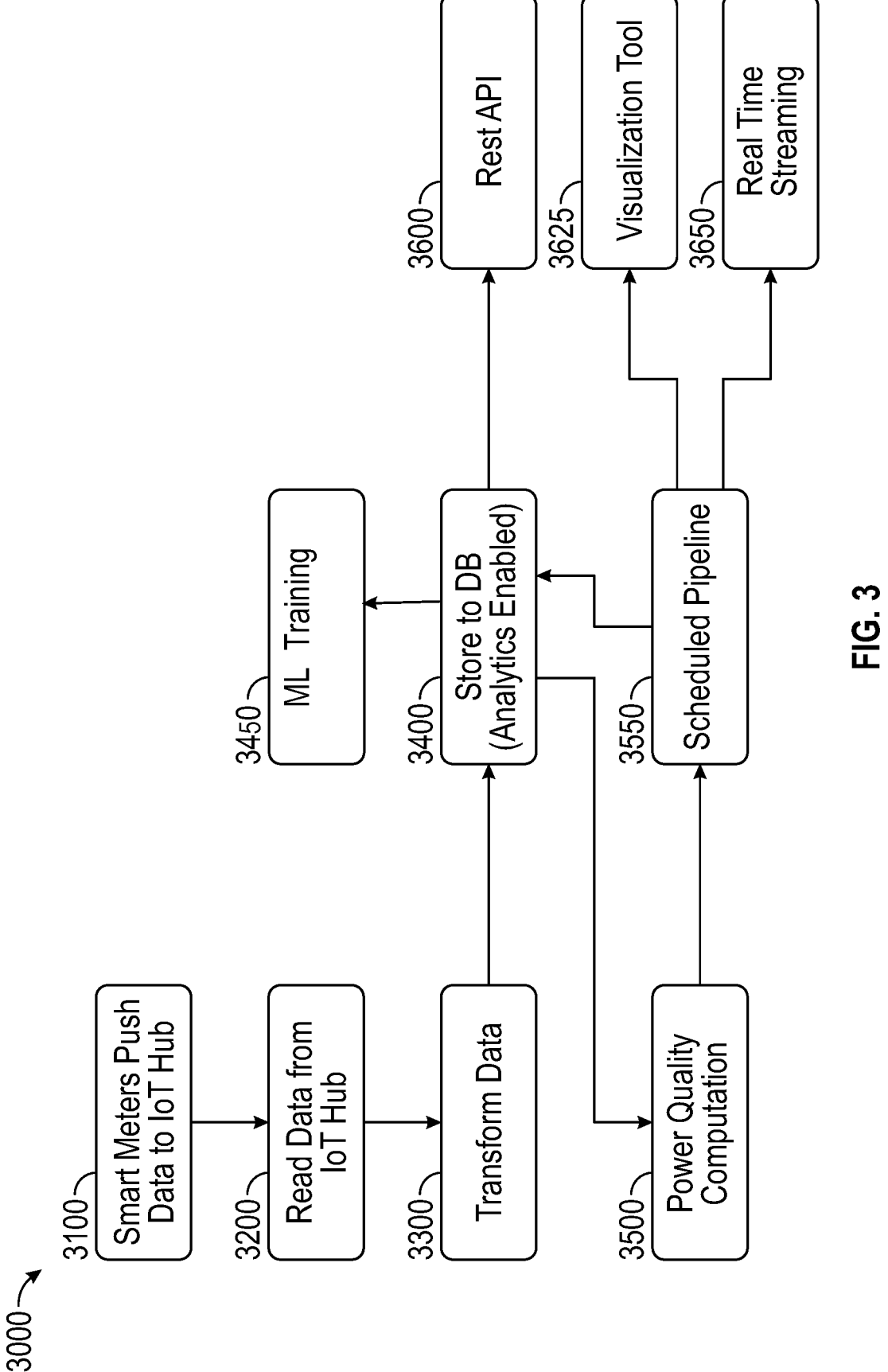
FIG. 3 is a flow-chart for a method of power quality analysis using the cloud based power quality analysis system of FIG. 1 in accordance with a non-limiting embodiment of the disclosed concept.

FIG. 3 is a flow-chart for a method 3000 of power quality analysis using the cloud based power quality analysis system of FIG. 1 in accordance with a non-limiting embodiment of the disclosed concept. The method 3000 may be performed by the cloud based power quality analysis system 1 of FIG. 1 or any components thereof.

At 3100, the smart meters transmit data to the IoT Hub of the cloud. The data include power quality parameters measured by the one or more smart meters.

At 3200, the event trigger-based service in the PQA algorithm reads the data from the IoT Hub.

At 3300, the event trigger-based service transforms the data.

At 3400, the event trigger-based service stores data (e.g., without limitation, the transformed data) in the data manager.

At 3500, the PQA engine performs mathematical computation of the power quality parameters based on the PQA algorithm.

At 3550, the PQA engine streamlines resultant data using scheduled pipeline(s). The method 3000 returns to 3400 and the resultant data are stored in the data manager. At 3450, the resultant data based on the PQA or any other data (e.g., historical power quality data) can be utilized further analytics to machine learning (ML) and/or visualization tools as needed.

At 3600, the resultant data are exposed via API(s) to the end user. At 3625, the resultant data are exposed to the end user based on the scheduled pipeline(s) via a visualization tool. At 3650, the resultant data are exposed to the end-user based on the scheduled pipeline(s) via real-time streaming. The resultant data may be exposed using at least one of the steps 3600, 3625 or 3650.

Figure 4:
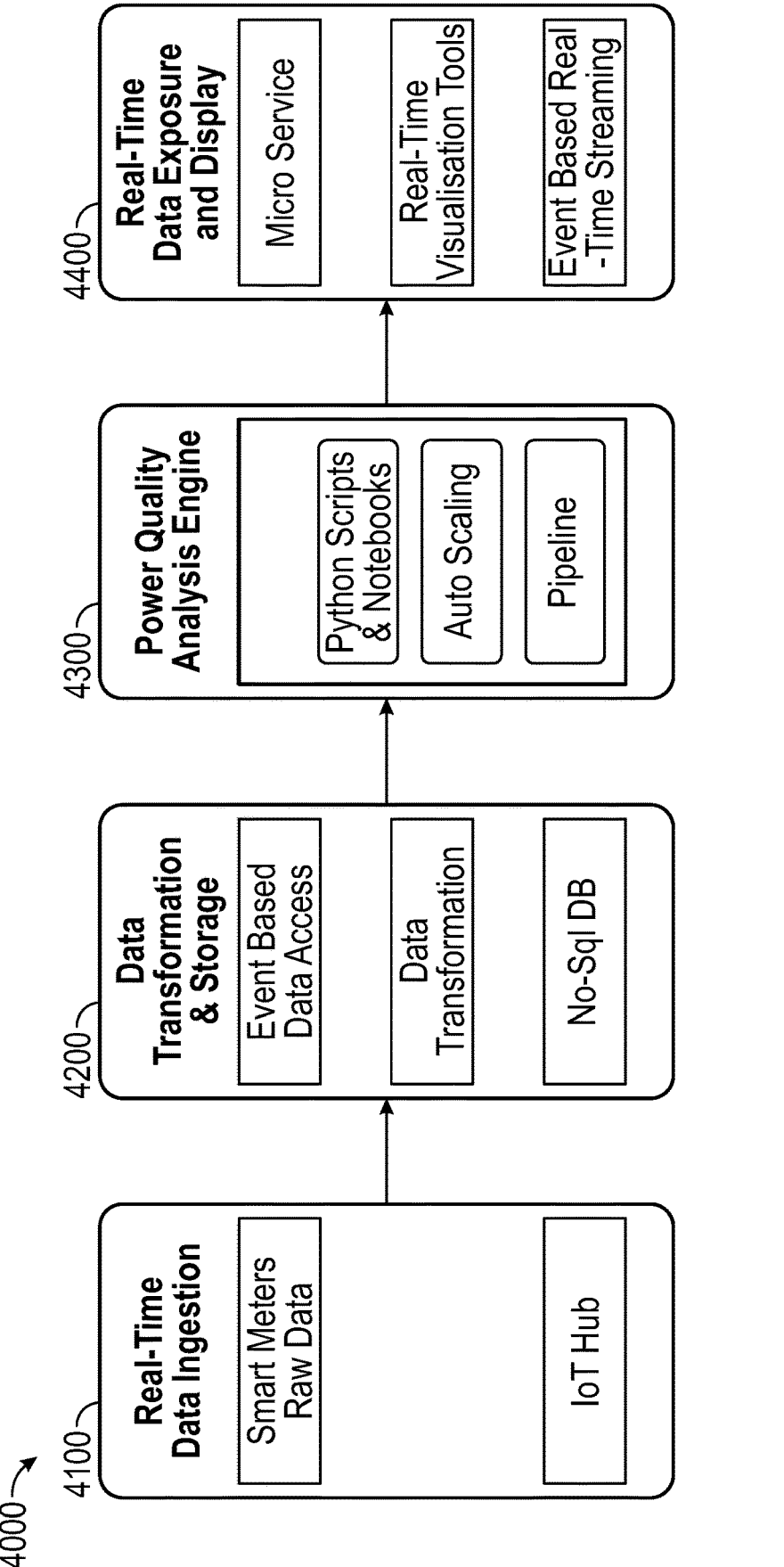
FIG. 4 is a block diagram for a method of power quality analysis using the cloud based power quality analysis system of FIG. 1 in accordance with a non-limiting embodiment of the disclosed concept.

FIG. 4 is a block diagram 4000 for a method 3000 of power quality analysis using the cloud based power quality analysis system of FIG. 1 in accordance with a non-limiting embodiment of the disclosed concept. The block diagram 4000 divides the method 3000 into four main steps.

At 4100, the cloud based power quality analysis system ingests real-time data. That is, the smart meters measure real-time power quality parameters of the devices included in the smart breaker network and transmit real-time the measured power quality parameters to the IoT Hub.

At 4200, the cloud based power quality analysis system reads the measured power quality parameters, transforms the power quality parameters and stores the transformed power quality parameters in the data manager. For an event trigger-based service, the event based data are accessed and transformed by the even trigger-based service included in the PQA algorithm. The transformed data are then stored in the data manager, which may be NoSQL database.

At 4300, the cloud based power quality analysis system performs PQA. The PQA engine performs PQA using Python scripts and/or notebooks, auto-scales the system, and streamlines the resultant data based on scheduled pipelines.

At 4400, the cloud based power quality analysis system exposes the resultant data. The resultant data may be exposed to the end user via API(s) in the form of microservice. The resultant data may be also exposed to the end-user via real-time visualization tools (e.g., without limitation, a display available on the smart meter or a control panel of the smart breaker network) or event-based real-time streaming (e.g., without limitation, on a display of a computing device such as a laptop, workstation, etc.).

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of disclosed concept which is to be given the full breadth of the claims appended and any and all equivalents thereof.

What is claimed is:

1. A power quality analysis system, comprising:

a smart breaker network having one or more smart meters coupled to respective loads and structured to measure power quality parameters;

a cloud comprising a hub that is coupled to the smart breaker network and structured to receive the power quality parameters from the one or more smart meters, the cloud operative to, via at least one computing device of the cloud:

execute a power quality analysis (PQA) algorithm to identify the power quality parameters to be measured and analyzed and define thresholds for the power quality parameters, and execute a PQA engine operative to read the power quality parameters and to:

perform PQA of the power quality parameters based at least in part on the power quality analysis (PQA) algorithm stored in the cloud, determine a number of loads coupled to the one or more smart meters, and responsive to determining an increase in a number of loads coupled to the one or more smart meters, perform an auto-scale process comprising:

calculating how many new nodes are needed to meet the current CPU and memory requirements, and issuing a scale-up request to add the required number of nodes, and scale-up to the number of nodes based on the scale-up request.

2. The system of claim 1, wherein the PQA algorithm includes a schedule for measuring the power quality parameters and performing PQA of the measured power quality parameters based on the schedule.

3. The system of claim 1, wherein the PQA engine is operative to trigger the auto-scale process based on a change of a number of devices included in the smart breaker network.

4. The system of claim 1, wherein the auto-scale is performed for each computation of the power quality parameters.

5. The system of claim 1, wherein the PQA algorithm includes an event trigger-based service that reads, transforms and processes the power quality parameters received from the one or more smart meters, and the PQA engine reads and performs PQA of the transformed power quality parameters based on the PQA algorithm.

6. The system of claim 1, wherein the resultant data are exposed to the end-user via an output device comprising at least one of an application programing interface (API) coupled to a data manager in the form of a microservice, a visualization dashboard, or real-time streaming on a display of a computing device.

7. The system of claim 1, wherein the PQA comprises mathematical computation of the power quality parameters based on the PQA algorithm.

8. The system of claim 1, wherein the power quality parameters identified by the PQA algorithm comprise at least one of network power (Vpn), peak-to-peak power (Vpp), reactive power (VAR), current (Amp), real power (Watt), apparent power (VA), power factor (PF), or frequency.

9. The system of claim 8, wherein the power quality parameters further comprise at least one of software zero crossing detection, unbalance of phase current, individual harmonics, total harmonic distortion, or total demand distortion.

10. The system of claim 1, wherein the hub comprises an IoT Hub and an event hub that is coupled to the IoT Hub and structured to transmit the measured power quality parameters received from the one or more smart meters to an event trigger-based service included in the PQA algorithm.

11. The system of claim 10, wherein the IoT hub includes a security-enhanced communication channel via which data from the one or more smart meters are transmitted and/or received.

12. A method of power quality analyzing of a distributed power system including a smart breaker network coupled to a cloud, the method comprising, via at least one computing device of the cloud:

receiving via a hub power quality parameters associated with the smart breaker network, the smart breaker network having one or more smart meters coupled to respective loads and structured to measure power quality parameters;

executing a power quality analysis (PQA) engine operative to:

perform PQA of the power quality parameters based on a PQA algorithm stored in a data manager of the cloud calculate a number of loads coupled to the one or more smart meters, and determine that there is an increase in a number of loads coupled to the one or more smart meters, and perform an auto-scale process comprising:

calculating how many new nodes are needed to meet the current CPU and memory requirements, and issuing a scale-up request to add the required number of nodes; and scaling-up to the number of nodes based on the scale-up request.

13. The method of claim 12, further comprising: creating a schedule for measuring the power quality parameters and performing PQA of the measured power quality parameters based on the schedule.

14. The method of claim 12, further comprising: triggering the auto-scale process based on a change of a number of devices included in the smart breaker network.

15. The method of claim 12, further comprising, via the at least one computing device of the cloud, exposing resultant data of the PQA to an end user, wherein the exposing resultant data comprises exposing the resultant data to the end user via an application programing interface (API) coupled to the data manager in the form of microservice.

\* \* \* \* \*